United States Patent [19]

Soboleski et al.

[11] Patent Number: 5,691,662

[45] Date of Patent: Nov. 25, 1997

[54] METHOD FOR MINIMIZING CLOCK SKEW IN INTEGRATED CIRCUITS AND PRINTED CIRCUITS

[75] Inventors: Alfred J. Soboleski, Sunnyvale; Yukio Sakaguchi, Los Altos, both of Calif.

[73] Assignee: Hitachi Microsystems, Inc., San Jose, Calif.

[21] Appl. No.: 632,166

[22] Filed: Apr. 15, 1996

Related U.S. Application Data

[63] Continuation of Ser. No. 224,443, Apr. 7, 1994, abandoned.

[51] Int. Cl.$^6$ .................... H03K 19/096; H03K 19/177
[52] U.S. Cl. .................... 327/292; 327/564; 327/565
[58] Field of Search .................... 327/141, 291–297, 327/564, 565; 326/93, 101

[56] References Cited

U.S. PATENT DOCUMENTS

| | | | |
|---|---|---|---|
| 4,812,684 | 3/1989 | Yamagiwa et al. | 326/101 |
| 5,012,427 | 4/1991 | Kuribayashi | 326/93 |
| 5,140,184 | 8/1992 | Hamamoto et al. | 327/565 |
| 5,239,215 | 8/1993 | Yamaguchi | 327/292 |
| 5,315,182 | 5/1994 | Sakashita et al. | 326/101 |
| 5,341,049 | 8/1994 | Shimizu et al. | 326/101 |
| 5,394,490 | 2/1995 | Kato et al. | 327/292 |

FOREIGN PATENT DOCUMENTS

| | | | |
|---|---|---|---|
| 403018044 | 1/1991 | Japan | 326/101 |

*Primary Examiner*—Timothy P. Callahan
*Assistant Examiner*—T. T. Lam
*Attorney, Agent, or Firm*—Flehr Hohbach Test Albritton & Herbert LLP

[57] ABSTRACT

Clock skew is minimized in an ASIC by grid-partitioning the IC chip into a number of preferably equal sized regions. An on-chip clock or buffer unit provides a clock signal to be distributed to buffers and clocked loads also on the IC. Equal length metal interconnect traces are formed in a preferably "H"-shaped configuration such that the termini and the center of the traces overlie buffer regions that will receive the distributed clock signal. Metallization interconnect paths are dictated by placement of joiner cells. By making each metal interconnect trace equal in overall length and in layer sub-lengths (if multiple metallization layers are present), clock skew along the interconnect traces is minimized macroscopically. A series of prioritized net lists is generated, defining interconnect paths to each region. A buffer is centrally located within each region, and is surrounded by a ring containing clocked loads to be coupled to the clock signal. The ring-shape causes the clocked loads to be substantially electrically equidistant from the associated region buffer, which minimizes skew microscopically. An updated series of netlists and a clocked load preplacement batch command file are generated, defining the clocked load connections. Placement and routing of the buffers, the clocked loads and then the remainder of the ASIC is accomplished using a conventional placement and router system. The invention may also be practiced to reduce skew in designing printed circuit boards.

14 Claims, 11 Drawing Sheets

```
COMPONENTS   numComps;
     [ - compName modelName [netName| * ] ...
     [ + GENERATE genericBlockName taskParm-bufInfo ]
     [ + SOURCE {NETLIST|DIST|USER} ]
     [ + FOREIGN foreignCellname pt orient ] ...
     [ + { FIXED | COVER | PLACED } pt orient ]
     [ + WEIGHT weight ]
     [ + REGION pt pt ] ; ] ...
END COMPONENTS NETS  numNets;
     [ - ( netName ] (compName pinName) ] ...
     [ MUSTJOIN ( compName pinName) )
     [ + regularWiring ]...
     [ + SOURCE ( NETLIST| DIST| USER} ]
     [ + ORIGINAL netName]
     [ + USE
        [SIGNAL|POWER|GROUND|CLOCK|TIEOFF|ANALOG)]
     [ + PATTERN (STEINER|BALANCED|WIREDLOGIC)]
     [ + ESTCAP wireCapacitance ]
     [ + WEIGHT weight ] ; ] ...

END NETS
```

FIG. 8A

```
- INST1    AN1  +   PLACED ( 100, 100 ) N ;
- INST2    AN1  +   PLACED ( 200, 100 ) N ;
- INST3    AN2  +   PLACED ( 300, 100 ) N ;
- INST4    AN2  +   PLACED ( 400, 100 ) N ;
- INST5    AN2  +   PLACED ( 500, 100 ) N ;
- INST6    AN2  +   PLACED ( 600, 100 ) N ;
- INST7    BFD  +   PLACED ( 700, 100 ) N ;
- INST8    BFD  +   PLACED ( 800, 100 ) N ;
- INST9    BTFD +   PLACED ( 100, 200 ) N ;
- INST10   BFF  +   PLACED ( 200, 200 ) N ;
- INST11   FF   +   PLACED ( 300, 200 ) N ;
- INST12   BFF  +   PLACED ( 400, 200 ) N ;
- INST13   FF   +   PLACED ( 500, 200 ) N ;
- INST14   FF   +   PLACED ( 600, 200 ) N ;
- INST15   AN1  +   PLACED ( 700, 200 ) N ;
- INST16   AN1  +   PLACED ( 800, 200 ) N ;
     ..     ..    ..       ..       ..
     ..     ..    ..       ..       ..
END COMPONENTS

NETS 10001 ;
- VDD  ( INST1 A ) ( INST2 A ) ( INST3 A ) ( INST4 A)
       ( INST5 A ) ( INST6 A ) ( INST7 A ) ( INST8 A ) ;
- VSS  ( INST1 C ) ( INST2 C ) ( INST3 C ) ( INST4 C )
       ( INST5 C ) ( INST6 C ) ( INST7 C ) ( INST8 C ) ;
- NET1 ( INST1 B ) ( INST2 B ) ( INST3 B ) ;
- NET2 ( INST4 D ) ( INST5 B ) ( INST6 B ) ( INST7 B ) ;
- NET3 ( INST7 B ) ( INST8 B ) ( INST9 B ) ( INST10 B )
       ( INST11 B ) ( INST12 B ) ( INST13 B ) ( INST14 B )
     + USE CLOCK;
     ..     ..    ..       ..       ..
     ..     ..    ..       ..       ..
END NETS

SPECIALNETS 2 ;
- VDD ( * VDD ) + STYLE POWERGRID;
- VSS ( * VSS ) + STYLE POWERGRID;
END SPECIALNETS

END DESIGN
```

FIG. 8B

```
DESIGN DEMO4CHIP ;
TECHNOLOGY DEMO4CHIP ;
ARRAY HG22S125 ;
UNITS DISTANCE MICRONS 100;

COMPONENTS 2000 ;

- INST7    BFD  +   PLACED ( 700, 100 ) N ;
- INST8    BFD  +   PLACED ( 800, 100 ) N ;
- INST9    BTFD +   PLACED ( 100, 200 ) N ;
- INST10   BFF  +   PLACED ( 200, 200 ) N ;
- INST11   FF   +   PLACED ( 300, 200 ) N ;
- INST12   BFF  +   PLACED ( 400, 200 ) N ;
- INST13   FF   +   PLACED ( 500, 200 ) N ;
- INST14   FF   +   PLACED ( 600, 200 ) N ;
- INST20   FF   +   PLACED ( 700, 200 ) N ;
- INST21   FF   +   PLACED ( 800, 200 ) N ;
    "      "   "        "     "
    "      "   "        "     "

END COMPONENTS

NETS 2 ;

- NET3 ( INST7 B ) ( INST8 B ) ( INST9 B ) ( INST10 B )
       ( INST11 B ) ( INST12 B ) ( INST13 B ) ( INST14 B )
    + USE CLOCK;

- NET31 ( INST20 B ) ( INST21 B ) ( INST22 B ) ( INST23 B )
        ( INST24 B ) ( INST25 B ) ( INST26 B ) ( INST27 B )
    + USE CLOCK;

"      "    "         "       "
    "      "    "         "       "

END NETS
```

FIG. 8C

```
- CLK1_DR1    CBB  +   PLACED  ( 1700, 100 ) N ;
- CLK1_DR2    CBB  +   PLACED  ( 1700, 100 ) N ;
- CLK1_DR3    CBB  +   PLACED  ( 1700, 100 ) N ;
- CLK1_DR4    CBB  +   PLACED  ( 1700, 100 ) N ;
- CLK1_DR5    CBB  +   PLACED  ( 1700, 100 ) N ;
- CLK2_DR1    CBB  +   PLACED  ( 2700, 100 ) N ;
- CLK2_DR2    CBB  +   PLACED  ( 2700, 100 ) N ;
- CLK2_DR3    CBB  +   PLACED  ( 2700, 100 ) N ;
- INST7       BFD  +   PLACED  (  700, 100 ) N ;
- INST8       BFD  +   PLACED  (  800, 100 ) N ;
- INST9       BTFD +   PLACED  (  100, 200 ) N ;
- INST10      BFF  +   PLACED  (  200, 200 ) N ;
- INST11      FF   +   PLACED  (  300, 200 ) N ;
- INST12      BFF  +   PLACED  (  400, 200 ) N ;
- INST13      FF   +   PLACED  (  500, 200 ) N ;
- INST14      FF   +   PLACED  (  600, 200 ) N ;
- INST20      FF   +   PLACED  (  700, 200 ) N ;
- INST21      FF   +   PLACED  (  800, 200 ) N ;
   ..           ..    ..        ..     ..
   ..           ..    ..        ..     ..

END COMPONENTS

NETS 200 ;

- CLK1_NET1 (CLK1_DR1 CLK) ( INST7 B ) ( INST8 B )
            ( INST9 B ) ( INST10 B ) ( INST11 B )
             ( INST12 B ) ( INST13 B ) ( INST14 B )
         +  ORIGINAL  CLK1 + USE CLOCK;

- CLK1_NET2 (CLK1_DR2 CLK) ( INST20 B ) ( INST21 B )
              ( INST22 B ) ( INST23 B ) ( INST24 B )
               ( INST25 B ) ( INST26 B ) ( INST27 B )
         +  ORIGINAL  CLK1 + USE CLOCK;
   ..        ..   ..       ..    ..
   ..        ..   ..       ..    ..

END NETS
```

FIG. 8D

METHOD FOR MINIMIZING CLOCK SKEW IN INTEGRATED CIRCUITS AND PRINTED CIRCUITS

This is a continuation, of application Ser. No. 08/224,443 filed Apr. 7, 1994 has been abandoned.

FIELD OF THE INVENTION

This invention relates to distribution of clock signals in high density integrated circuits, printed circuits, and the like, and more specifically to a method for minimizing skew in clock signals distributed to different regions in such circuits.

BACKGROUND OF THE INVENTION

The preferred embodiment of the present invention is the minimization of clock skew in an integrated circuit. Although the present invention may also find application in clock distribution on a printed circuit board, the background of the invention will focus on the preferred embodiment.

Modern high density application specific integrated circuits ("ASICs") are required to deliver high performance in a variety of critical applications. Many such ASICs operate from a master clock signal that is distributed to clocked loads, often via buffers, at different locations on the ASIC chip. Frequently these clocked loads include flip-flops, latches, binary cells, and the like, and the term "clocked load" as used herein may refer to any such loads.

Usually the clock signals are distributed on metal lines or traces that are formed on one or more layers that overlie the ASIC. Vias couple the clock signals from the metal lines to the underlying clocked loads. A given length of such metal line will have distributed resistance and capacitance. Understandably, clock signals coupled to loads overlong metal lines will be delayed (or skewed) relative to clock signals provided over short metal lines. This skewing can result from differences in accumulated resistance and capacitance, both within a single metal layer, and between metal layers. Even if two buffers receive the same clock signal over equal lengths of interconnect path, skew can still occur if the buffers present substantially different load impedances to their drivers. Thus, load impedance equalization is also an important design consideration in minimizing skew.

Unfortunately skewing can degrade the ASIC performance, especially at high clock frequencies where the amount of skew can represent a substantial percentage of the clock period. In fact, a poorly implemented clock distribution system can render an ASIC design non-functional.

It is known in the prior art to minimize clock skew by attempting to equalize the lengths of metal lines that distribute the clock signals. If each such line could be made identical in length (including the length found at each metallization layer), clock skew would be substantially minimized. The problem, however, is how to achieve such equalization in practical applications.

Generally, the prior art tends to defer distribution of the clock metallization lines until after the rest of the ASIC has been laid out. Stated differently, in the prior art, the clock metallization is fitted more or less into whatever routes are potentially available at the end of the layout process.

Usually the ASIC designer provides a netlist that specifies circuit functions and interconnects, and hard grouping information that specifies what components or functions the designer wants grouped together. Further, the ASIC designer specifies a general floor plan or layout of the chip that can specify what IC regions must be reserved or dedicated to specific functions. For example, a substantial portion of the IC area may be dedicated to fabrication of a large block of RAM, which area is not available to locate clocked destination devices.

While commercially available tools can route and place clock metallization lines given these inputs from the ASIC designer, the resultant lines do not produce minimum clock skew.

One prior art approach has been the use of a fixed clock grid, wherein the ASIC designer attempts manually to equalize clock line lengths during the base array/floor plan definition design phase. Historically this line routing method has had some success. However, modern high density, large scale complementary metal-oxide-semiconductor ("BiCMOS") and CMOS integrated circuits make use of the method increasingly difficult. Further, because it requires a high degree of manual trial-and-error, this routing method precludes rapid turnaround time in fabricating new circuits.

What is needed is a method for closely controlling clock distribution through an ASIC design such that clock skew is essentially eliminated. Given the design of the underlying ASIC, such method should be rapidly implemented, preferably using commercially available placing and routing equipment, and should be essentially transparent to the ASIC designer.

The present invention provides such a method.

SUMMARY OF THE PRESENT INVENTION

In the prior art, clock trace routing is considered only after the clock-driven components have been positioned. By contrast, the present invention regards the clock and its distribution as having greater importance than placement of clock-driven components in an ASIC.

According to the present invention, an on-chip clock or buffer unit is preferably located at the center of the ASIC chip and is defined by a first clock net. The ASIC designer's netlist, hard grouping information and floor plan information are examined with respect to approximately where clock-driven components ("clocked loads" or "clocked destinations") shall be placed. Further, this input information advises which regions of the IC chip may not be used for interconnecting clock signals.

The IC chip is then partitioned into coordinate defined regions, wherein each region contains a buffer that is surrounded by an island of associated clocked destinations that shall be driven by that buffer. It is the function of the present invention to provide interconnect paths that couple the on-chip clock/buffer unit to the buffers and their associated clocked destinations, with minimum clock skew. Preferably the on-chip clock/buffer unit provides a dedicated buffer for each island-surrounded buffer.

A series of netlists is created from the on-chip clock/buffer unit to each buffer, and the order in which the netlists shall be routed is specified. Preferably the metalization interconnect traces from the on-chip clock to the region buffers define "H"-shaped configurations, wherein the arms of each "H" terminate at a region buffer position. (Conventional vias couple the interconnect traces to the on-chip clock and region buffers.) Joiner cells, through which a conventional placement router tool will route, are positioned to segment the net and provide the desired "H"-shapes. The total metalization length from the on-chip clock to each buffer position is equal, and further metallization layer 1 and metallization layer 2 sub-lengths comprising the interconnect metalization length are also equal. This minimizes skew and capacitive effects at a macroscopic level, e.g., from the on-chip clock to each region buffer.

Each region buffer is then surrounded by an island of clocked destinations within a soft group that are to be driven by that buffer. A net is declared for each such buffer. The associated group of clocked destinations are arranged in a donut-shaped ring around the buffer, such that each clocked destination is substantially the same electrical distance from its associated buffer. To help equalize skew effects, each buffer preferably drives the same number of actual (or equivalent) clocked loads. Additional nets are declared for each clocked load.

The placement router then routes between each buffer and the clocked loads in the associated island. Because the clocked loads are substantially equidistant from their associated buffer, each buffer-clocked load path length is substantially equal within an acceptable skew error margin. This minimizes skew at the microscopic level.

In this fashion, the present invention minimizes clock skew both at the macroscopic level wherein on-chip clock signals propagate along equal length metal traces, and at the microscopic level, wherein each clocked load is substantially equidistant from the region buffer.

Other features and advantages of the invention will appear from the following description in which the preferred embodiments have been set forth in detail, in conjunction with the accompanying drawings.

BRIEF DESCRIPTION OF THE DRAWINGS

FIG. 8A depicts an input DEF file in ASCII format, as used by the present invention;

FIG. 8B further depicts an input DEF file, as used by the present invention;

FIG. 8C depicts an output DEF file, as used by the present invention; and

FIG. 8D depicts a DEF modification file, as used by the present invention.

DETAILED DESCRIPTION OF THE PREFERRED EMBODIMENT

Figure 1:
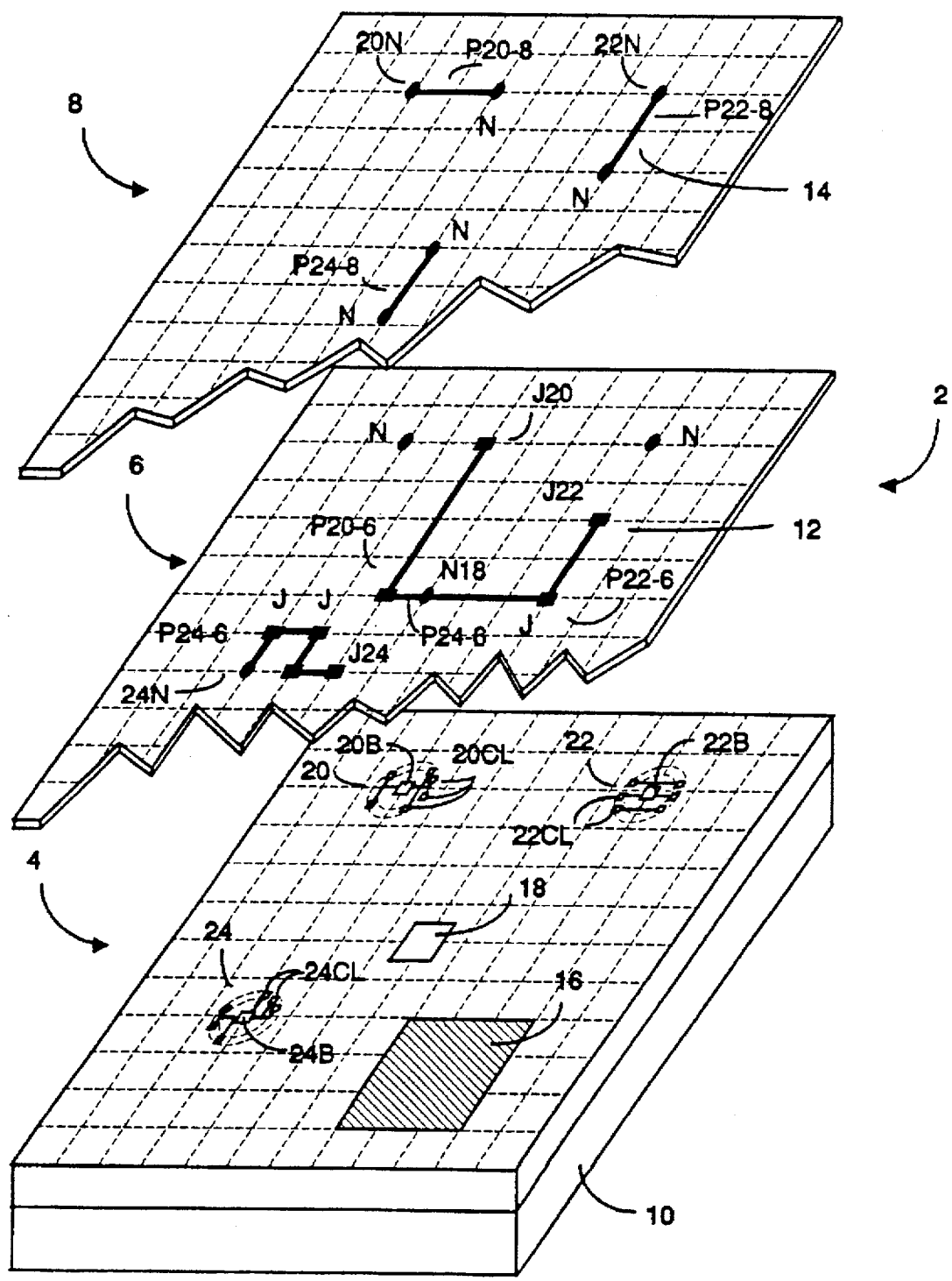
FIG. 1 is a generic depiction of an integrated circuit with reduced clock skew, according to the present invention.

FIG. 1 is a simplified depiction of an integrated circuit ("IC") chip 2 that includes layers 4, 6, 8 that contain the devices comprising the ASIC and interconnecting traces. An IC may contain more or fewer layers, but the layers are fabricated a semiconductor substrate 10. Level 4 contains what will be referred to as a base array circuit, and may also include circuitry and components to which clock signals need not be coupled, e.g., region 16. Of course, there may be several such non-clocked regions and they need not reside in a corner as shown. Of course, it is understood that instead of representing a semiconductor IC, FIG. 1 could instead represent layers in a multi-layer printed circuit board, wherein clock skew is to be minimized.

Generally, the upper layers, e.g., 6 and 8 in FIG. 1, include conductive interconnect traces 12 and 14 that are typically metal. For ease of illustration, FIG. 1 only depicts components and traces important to an understanding of the present invention. For example, inter-level vias that couple portions of the various layers are not depicted. It is also understood that the various layers comprising an IC are in close contact with each other, rather than spaced-apart as depicted in FIG. 1.

According to the present invention, the various layers comprising the IC are deemed partitioned into a grid-like assembly of preferably rectangular regions. In FIG. 1, the phantom lines dividing layers 4, 6 and 8 into regions are understood not to exist physically, but merely to serve as a reference coordinate system.

Layer 4 includes a master clock or buffer unit 18 whose clock output signal(s) will be coupled through vias (not shown) and the various metal interconnect traces 10, 14 to various clock buffers or drivers, e.g., 20B, 22B and 24B. Although unit 18 is preferably disposed centrally on IC 2 for ease of symmetry, it need not be centrally located. Preferably unit 18 includes one buffer for each of the clock buffers or drivers 20B, 22B, 24B, although unit 18 would instead include fewer buffers that had greater load fanout capability.

Figure 3A:
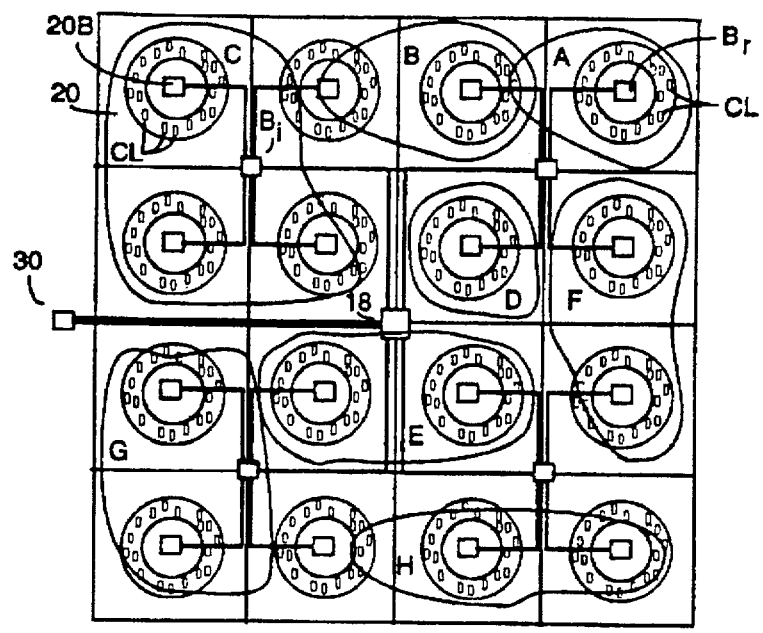
FIG. 3A depicts a logical hierarchy for soft grouping clocked loads assignable to a regional buffer, according to the present invention.
Figure 3B:
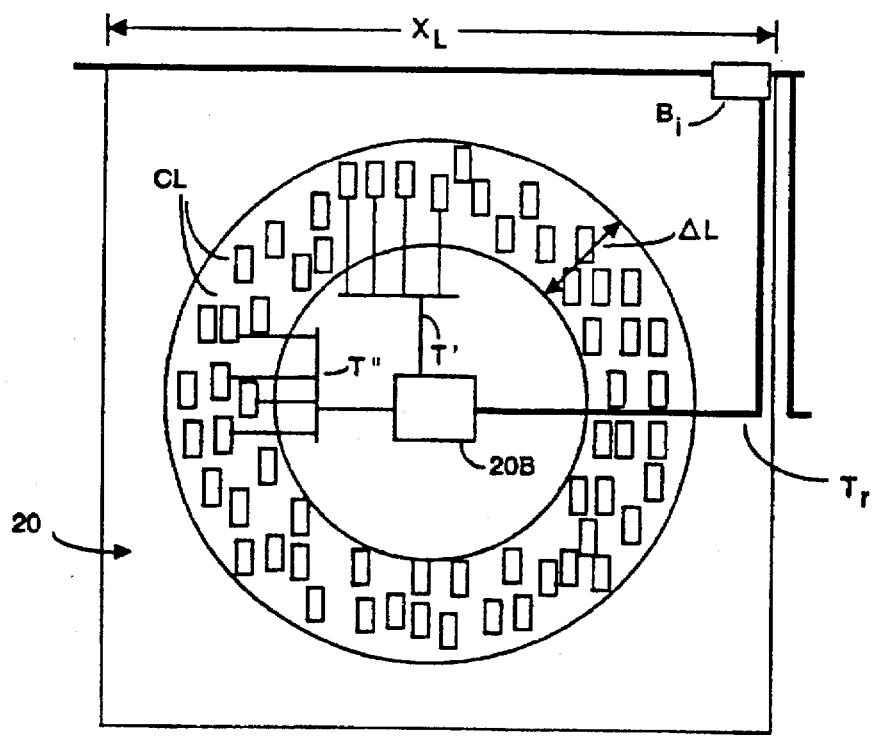
FIG. 3B is a detailed depiction of a clocked load island, according to the present invention.

Each buffer or driver 20B, 22B, 24B preferably is centrally located within a region that is surrounded by an island e.g., 20, 22, and 24. As best seen in FIGS. 3A and 3B, within the islands are the various clocked loads (e.g., 20CL, 22CL, 24CL) that are to be driven by the signal from the on-chip master clock 18 by way of the interconnect traces.

Of course, layer 4 can in practice include thousands of clock islands, rather than the three depicted. Also, there may be intermediate levels of clock buffering between the master clock 18 and the region clock buffers, for example, to enhance fanout. (See, for example, FIG. 4.) As used in this context, "level" denotes not a semiconductor fabrication level, but rather where in a sequence of series-coupled buffers a given buffer is to be found.

By definition, clock skew is the discrepancy in time between the clock signal seen directly at master clock 18, and the clock signal seen at the various clocked loads within each clock island. It is the purpose of the present invention to provide a method whereby such clock skew is effectively minimized, preferably to 200 ps or less.

With reference to FIG. 1, the present invention provides a substantially constant length metal trace interconnect path between the on-chip master clock and the terminus node of each interconnect path. In practice, one or more portions of a given interconnect path may be fabricated on layer 6 and/or layer 8. Traces on different layers may have different associated capacitances and can thus influence skew differently. Thus, the present invention requires not only that the total length for each interconnect path be the same as the total length for other interconnect paths, but also that the sub-lengths of each path fabricated on each metallization layer are also equal.

In FIG. 1, the reference point for the various interconnect paths is the center node N18, which communicates with underlying on-chip master clock/buffer unit 18 through a via. At node N18 and indeed at other nodes N, an inter-layer via will be present to couple signals from layer to layer.

Consider first the interconnect path from N18 to terminus node 20N, which overlies and is coupled to buffer 20B by a via (not shown). This interconnect path consists of a path length on layer 6 (denoted P20-6) plus a path length on layer 8 (denoted P20-8). Sub-length P20-6 is shown as 5 units long, and sub-length P20-8 is 2 units long, a "unit" being the side of a square defined by the phantom coordinate lines. Thus, the total interconnect path from N18 to terminus node 20N is 7 units. Similarly, from N18 to the terminus node 22N associated with buffer 22B is P22-6 (5 units) plus P22-8 (2 units) or 7 units total. Likewise, from N18 to the terminus node is P24-6 (5 units) plus P24-8 (2 units), or 7 units total.

Note that while any of these interconnect paths could be shortened, so doing is undesirable unless all paths can be appropriately shortened. It is understood, for example, that a clock signal propagating along a seven unit long path can arrive at a clocked destination sooner than will the same signal propagating along a six unit long path.

The present invention achieves a tightly controlled initial distribution of the interconnect paths by creating a netlist that contains joiner or driver cells (denoted J in FIG. 1). A joiner cell is simply a dummy pattern of metal whose presence forces a placement router tool to pass through the joiner cell and to turn 90°, thus locating a metal interconnect trace where desired, according to the present invention. Preferably the joiner cell occupies the same chip area as a clocked buffer, which simplifies rebuffering the associated net, whose terminus is a joiner cell. For example, a dummy buffer could be located at level 4 beneath what would otherwise be the location of a joiner cell at level 6.

Joiner cell positioning intentionally lengthens some interconnect paths to force substantially equal metallization interconnect trace lengths. So doing substantially equalizes the propagation contribution of each path upon the master clock signal from node 18N. This minimizes clock skew from the on-chip clock to the region buffers, at least on a macroscopic level.

The placement of the joiner cells commands a generic placement router tool such that the interconnect paths are laid out in a very predictable manner. The preferred embodiment is practiced using the Gate Ensemble placement router system, a commercially available package. A similar system, known as Gate Compiler, is available commercially from Compass Design Automation.

The present invention coerces the placement router system to behave in a predictable manner. Conventionally, the internal algorithms associated with such placement router systems dictate that the desired default path is the shortest path. However, to equalize interconnect traces according to the present invention, the desired path is generally not the shortest path. By judicious placement of joiner cells, the present invention forces a conventional placement joiner system to run traces through the joiner cells, and to thus equalize interconnect lengths and minimize skew, at least on a macroscopic scale.

Figure 2A:
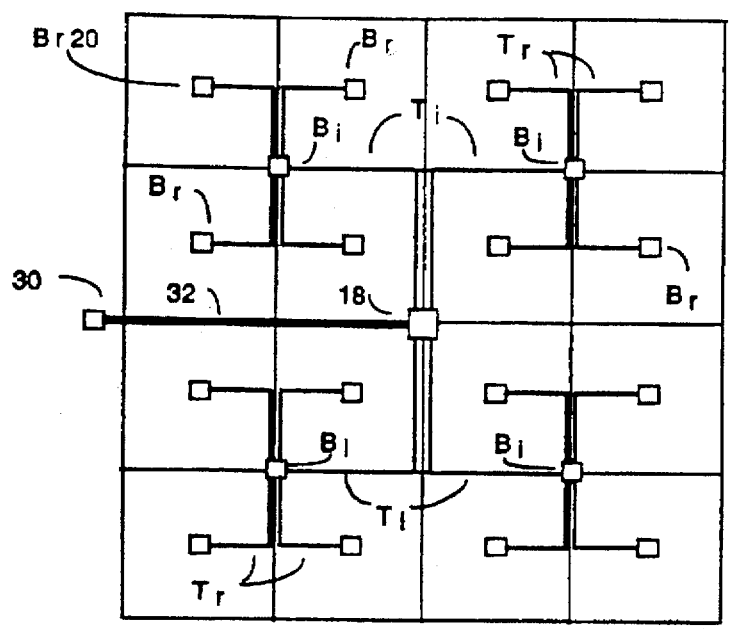
FIG. 2A and FIG. 2B depict fixed clock buffer "H"-shaped patterns for different underlying ASIC base arrays, according to the present invention.
Figure 2B:
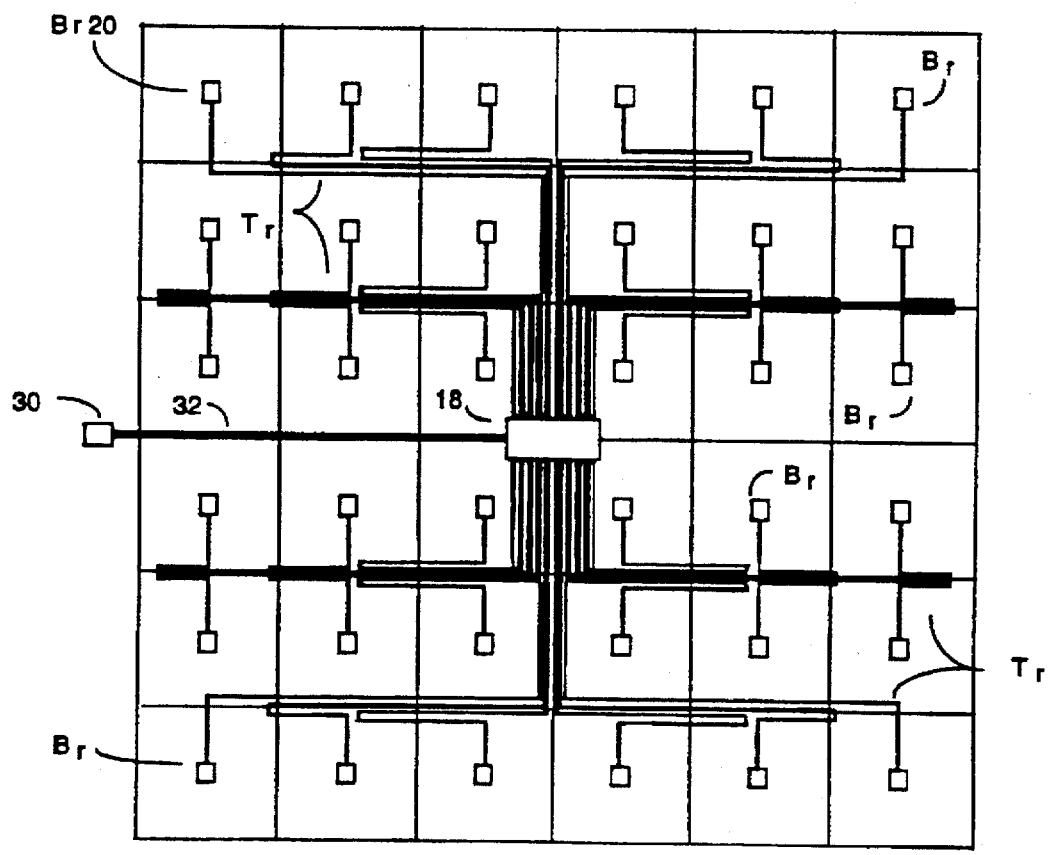

Thus, as shown by FIG. 1, the present invention reduces skew between the center node N18 and the terminus node of each interconnect path by equalizing not only total interconnect path lengths, but also sub-lengths on each metallization layer. The equalization process is accomplished by grid-partitioning the various layers and by inserting joiner cells to satisfy the length and sub-length requirements and to meet the electrical requirements of each distribution net. FIG. 1 is a generic representation, drawn for ease of illustration. In practice, the preferred embodiment of the present invention utilizes "H"-shaped interconnect segments to satisfy each net (as shown in FIGS. 2A and 2B).

As described above, the master clock signal travels equal distances to arrive at the terminus node (20N, 22N, 24N) associated with each clocked buffer (20B, 22B, 24B), thus minimizing skew at the macroscopic level. The present invention next minimizes skew at the microscopic level by ensuring that the path lengths from the terminus nodes to each associated clocked load (e.g., the plurality of loads 20CL, 22CL and 24CL) are electrically substantially equal within an acceptable error tolerance. (Preferably each buffer drives the same number of equivalent loads, to further equalize skew.)

As shown in FIG. 1 (and seen in more detail in FIG. 3A) electrically equal region buffer-to-clocked load path lengths result from locating each group of clocked loads within a typically donut-shaped island ring surrounding the associated buffer. The terms "donut-shaped" or "ring-shaped" will be used to describe the locations of the clocked loads around their associated buffer. However, the island shape may in fact be elliptical rather than circular. Interconnections between the clocked loads and their associated buffers are made using metal traces 12 and 14, which traces may not exhibit perfectly identical wiring characteristics. If, for example, traces 12 exhibited lower resistivity than traces 14, the "donut-shaped" island would preferably be elongated along the axis of the level 6 traces 12. Although one axis of the island traces would present a longer trace length than the other axis, the effective electrical distances between the clocked load and the associated buffer would still be equal electrically.

Because the clocked loads are thus placed substantially equidistant electrically from the associated buffer within a donut or elliptical ring, a conventional placement router system (e.g., a system from Gate Ensemble) is allowed to route the buffer-to-clocked loads connection paths unassisted. The margin of error is acceptably small, and indeed statistically there appears to be some compensation in that some buffer-to-clocked load connection paths may be slightly longer electrically than nominal and some such paths will be slightly shorter electrically than nominal. It will be appreciated that while the present invention dictates placement of the metal interconnect lines, fabrication of the underlying ASIC is not disturbed.

FIGS. 2A and 2B depict different fixed clock buffer "H"-patterns for two different ASICs, according to preferred embodiments of the present invention. A master signal at pad 30 is coupled through trace 32 to the centrally located on-chip clock or buffer unit 18, which may in fact be a plurality of buffers. Preferably unit 18 provides a separate buffer for each island, although fewer buffers having multiple fanout capability might be used instead. Because the IC chip is partitioned into clocked zones, an "H"-pattern advantageously permits trimming back an arm of the "H" without substantially affecting load impedance due to the buffering that is used. Preferably such trimming occurs during distribution of regional buffers.

In FIG. 2A, sixteen regions as shown, wherein four intermediate buffers Bi are coupled by equi-length traces Ti to the on-chip clock 18. These four intermediate level buffers Bi may each be considered as being located at the center of a region comprising the four adjoining square regions. Centrally located within the regions are regional buffers Br coupled by equi-length traces Tr to an intermediate buffer Bi. In FIG. 2A, the buffer Br20 in the upper left-hand corner could in fact be buffer 20B in FIG. 1.

FIG. 2B depicts metal interconnect routings for a different underlying ASIC, wherein an off-chip clock signal may be coupled through pad 30 and trace 32 to the centrally located clock/buffer 18. In FIG. 2B, twenty-four regions are depicted, each containing a centrally located buffer Br, coupled by equi-length traces in an "H"-shaped configuration to clock/buffer 18. The buffer Br20 in the upper left-hand corner may, for example, be considered to be buffer 20B in FIG. 1. Note in FIGS. 2A and 2B that a hierarchy of "H-shaped" configurations is present. For example, one "H"-shaped configuration is centered about clock/buffer unit 18, whose arm termini form the centers of other "H"-shaped configurations. There could, of course, be fewer or more nests of "H"-shaped configurations than what is shown in FIGS. 2A and 2B.

FIG. 3A is similar to what is shown in FIG. 2A except that the hierarchically soft grouped clocked loads and clock islands are now depicted. As in FIG. 2A, sixteen regions whose regional buffers Br are coupled to an on-chip clock/buffer 18 are shown. For example, the upper left corner of FIG. 3A shows regional buffer 20B surrounded by an island 20 that contains a plurality of clocked loads CL arranged in a donut-ring configuration. For ease of illustration, the clocked loads are shown placed within a circular-shaped donut-ring, although as noted the ring could in fact be elliptical to compensate for electrical differences in the interconnect traces at the various wafer levels.

Generally when the ASIC is designed, the ASIC designer assigns clocks to the design, and designates how many clocked loads should be associated with a given region. However, the ASIC designer is not concerned with clock distribution or fanout, per se. Typically, it suffices that for each unique clock, the ASIC designer assign a clock name and associated clocked loads. (Although the preferred embodiment has been described with respect to a single master clock signal, of course the present invention is also applicable to a system having multiple master clock signals.)

It suffices for the ASIC circuit designer to commit a number of clocked loads to what the present invention grid-designates as a region. The present invention makes a logical hierarchial soft grouping of clocked loads, associating soft groups with regions. The ASIC designer's netlist is then changed to assign new clock net names for all clocked loads within each soft group, which soft groups are shown as A, B, C, D, E, F, G and H in FIG. 3A. The present invention generates preplacement command files for the clocked loads, the netlist is updated, and a clocked load preplacement batch command file is created.

FIG. 3B shows in detail a typical region, for example the region containing regional buffer 20B and island 20. In the preferred embodiment, each region has a side dimension $X_L$ of about 1,800 μm, although other dimensions could be used instead. A plurality of clocked loads CL are positioned within a donut-shaped ring centered upon regional clock/buffer 20B and comprising island 20. In the preferred embodiment, the ring has a ring dimension ΔL of 300 μm, although other sizes could be used. Since FIG. 3B depicts a circular-shaped ring, it is assumed that the electrical characteristics of the traces 12 and 14 are substantially equal.

In FIG. 3B, an intermediate buffer Bi is shown in the right-hand corner, whose clocked signals are coupled by traces Tr to the regional clock/buffer 20B. It is understood that clock/buffer 20B may in fact include a plurality of buffers, whose substantially identical outputs are coupled by traces to a preferably equal number of clocked loads CL. For example, trace T' and trace T'' each couple four clocked loads CL to clock/buffer 20B. Of course in practice, the number of clocked loads coupled to each buffer is substantially larger than four, more typically two hundred or so.

Whereas a conventional placement router system was essentially constrained by joiner cell placement to predictably route metal interconnect traces, the placement router system is given considerably leeway in interconnecting the various clocked loads CL to the associated region buffer. However, this final clock interconnect distribution is actually indirectly controlled in that the clocked loads will have been placed within a small ring surrounding the associated regional (e.g., island) buffer. In practice, the interconnects from the clocked loads to their associated regional buffer will be a statically substantially constant radius electrically.

In any event, the distances contributed by these regional buffer-to-clocked load interconnects is but a tiny fraction of the total interconnect length from the on-chip clock or buffer unit. As a result, skew error resulting from unequal island buffer-to-clocked load interconnects is relatively negligible.

Figure 4:
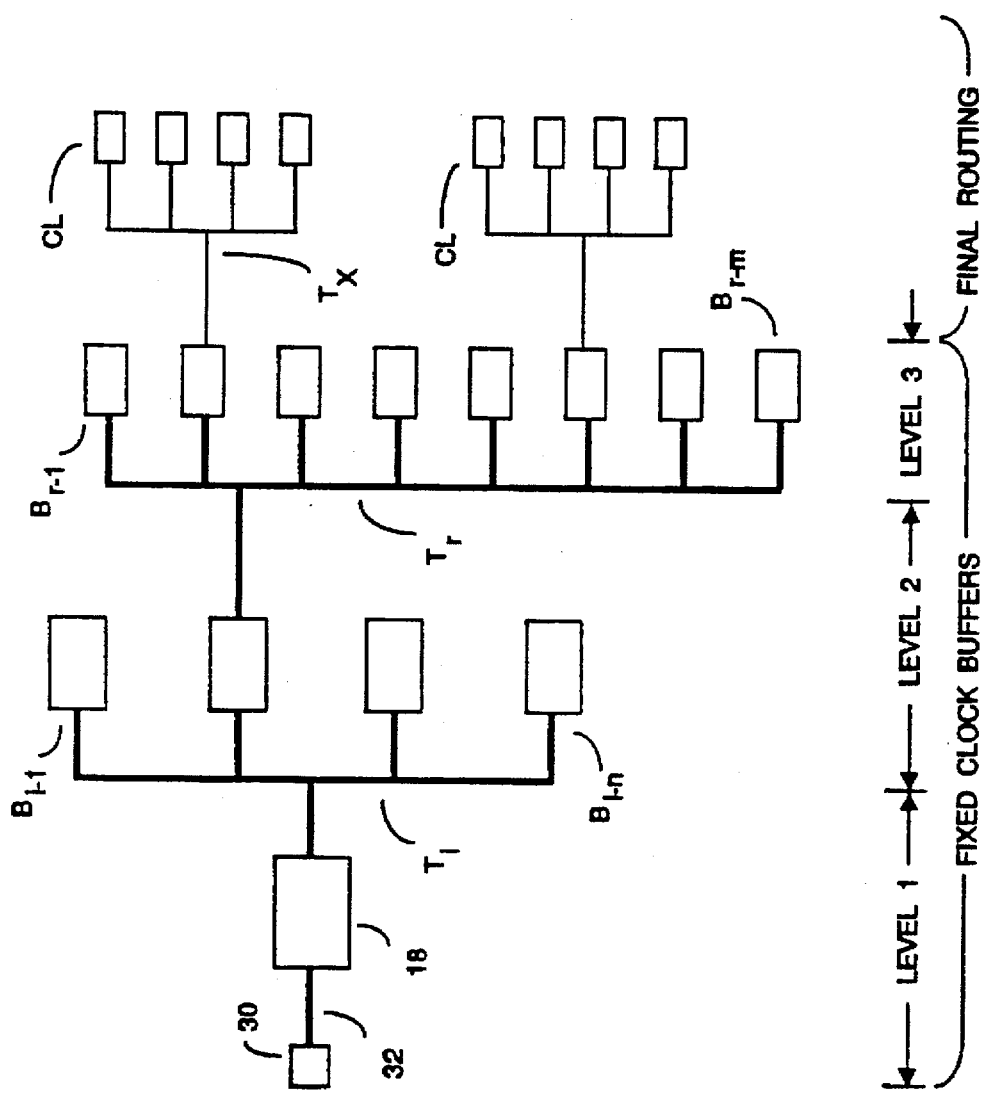
FIG. 4 is a schematic depiction showing macroscopic and microscopic skew minimization, according to the present invention.

FIG. 4 depicts macroscopic and microscopic skew minimization, over three levels (e.g., stages) of buffering, according to the present invention. In FIG. 4, the first three levels or stages of buffering are denoted fixed clock buffers in that interconnect lengths are forced to be substantially equal, in total length, in metallization layer sub-length, and in impedance load presented, thanks to joiner cell placement. Collectively, buffers 18, Bi and Br and the preferably "H"-shaped pattern of interconnect traces define a fixed clock tree.

Preferably the fixed clock tree takes into account the total number of clock buffers at the various stages, the size of the base array and location of operating voltage busses (whose presence can deny certain areas of layers 6 and 8 for purposes of routing "H"-shaped interconnects), the magnitude of RAM, ROM and other block modules (whose presence at layer 4 can affect interconnect routings at levels 6 and 8), and the specific clocked loads used in the ASIC design. This information is used to distribute and pre-route the clock buffers and associated interconnects such that, macroscopically, skew is as close to zero as is possible.

As noted, microscopically, the final routing of the island interconnects to the clocked loads is done by the placement router algorithm, but only after the various load cells are placed within donut-shaped rings surrounding an adjacent island buffer. It is understood that skew is affected by the degree of interconnect equalization achieved for the fixed clock buffers, and also (but to a lesser extent) by the final routing to the clocked loads.

In FIG. 4, the first level buffering occurs when, at pad 30, an off-chip clock signal is received and coupled by trace 32 to the on-chip clock/buffer 18. Traces Ti then couple the output from clock/buffer 18 to various buffers Bi-1 through Bi-n, in the same manner as depicted in FIG. 2A and FIG. 2B. These buffers Bi comprise the second level or stage of buffering.

For ease of illustration, FIG. 4 shows only the second buffering as providing an output signal on traces Tr to several third stage buffers Br-1 through Br-m. Again, the traces Tr and buffers Br are preferably similar to what is depicted in FIGS. 2A and 2B. For ease of illustration, only two of the Br buffers are shown coupled by traces Tx to a preferably equal number of clocked loads CL. According to the present invention, if the ASIC design does not provide a sufficient number of clocked loads to ensure equal buffer loading, dummy equivalent impedance loads will be fabricated and coupled as necessary to the Br buffers.

With reference to FIGS. 3A and 3B, it is understood that the Br buffers are preferably located in the center of a donut-shaped or elliptical-shaped configuration that contains the various associated clocked loads CL. The traces Tx (which are analogous to traces T', T" in FIG. 3B) are positioned by the placement router tool used with the present invention. Although the placement router tool has some discretion in routing these traces, because of the island configuration used, these traces will be substantially equal in electrical length.

According to the present invention, the skew time $T_d$ is given by:

$$T_d = T_f + K[C_{unitgate} \cdot \Sigma LV + C_{unitgate} \cdot \Sigma FANOUT]$$

from which equation, it is apparent that:

$$T_d = T_f + K[C_{unitgate} \cdot \Sigma LV] + K[C_{unitgate} \cdot \Sigma FANOUT] = T_A + T_B$$

where $C_{unitgate}$ is the capacitance associated with each clocked load, K is the ohmic loss associated with the preferably equal length interconnect traces, and where FANOUT is the preferably equal number of clocked loads coupled to the buffers. $T_A$ is a fixed delay time associated with the fixed clock buffers of FIG. 4, a delay that is substantially zero in magnitude. $T_B$ is associated with the placement of the clocked loads CL in FIG. 4, and represents a variable delay that typically is less than about 200 ps, according to the present invention.

In practice, if the allowed skew time is say 200 ps, e.g., the variation in $T_D$ is, then for a FANOUT=20, it follows that:

$$\Delta C = \frac{\Delta T}{K \cdot FANOUT} = \frac{200 \text{ ps}}{110 \Omega \cdot 20} = 0.1 \text{ pF}$$

The above implies that a 0.1 pF capacitance difference is acceptable, which is equivalent to a metal trace interconnect length difference $\Delta L$ of about 357 μm, an acceptable and realizable variation.

Figure 5:
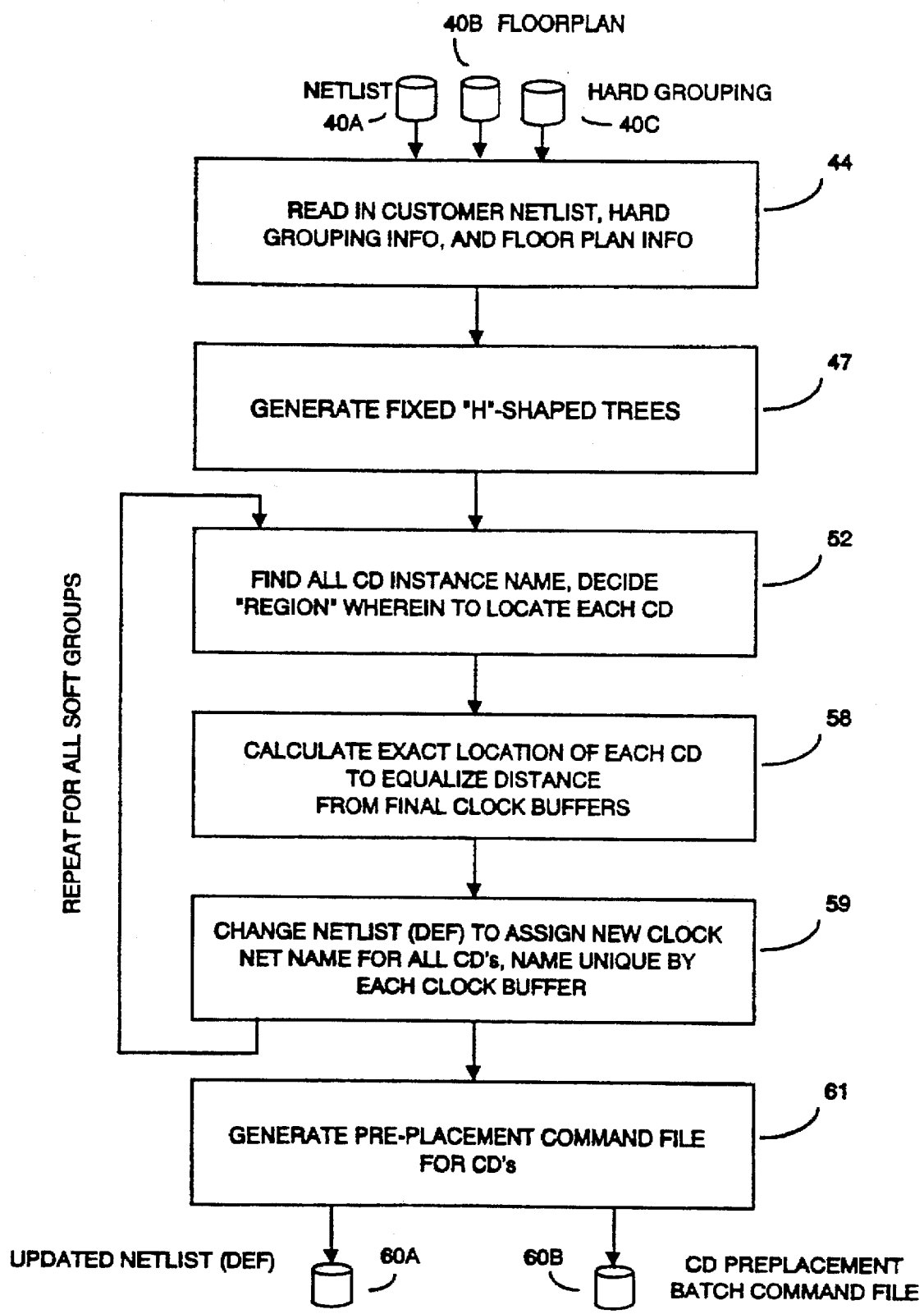
FIG. 5 is a flow diagram depicting workflow associated with generation of an updated netlist and clocked load preplacement batch command file, according to the present invention.

FIG. 5 depicts the general workflow of the present invention, wherein input data includes input netlist 40A, floorplan information 40B, and hard grouping information 40C. Preferably netlist 40A is in design exchange format ("DEF"), although other formats could instead be used. DEF is an ASCII representation that uses syntax conventions, but has the limitation that DEF file lines are truncated beyond 2048 characters. The ASIC designer-provided input information will include all parameters required to evaluate clock distribution. These parameters may include, without limitation, clock buffer specification, metal interconnect and connective via characteristics for loading, and possibly for secondary effects such as cross-coupling, and fringe effects. Preferably the design does not buffer the clocks in that all clocks, of the same type carry the same name and assignment directly to their respective clocked load designations.

At step 44, the ASIC-designer input 40A, 40B, and 40C is received into the present invention. Using this information, at step 47 a fixed "H"-tree pattern of traces is generated, wherein interconnect lengths and metallization layer sub-lengths are substantially equal. As noted, such equalization follows from placement of joiner cells J.

At step 52 the present invention quantizes the grid-defined rectangular regions into donut-shaped regions. Any clocked device located within a given grid area becomes a candidate for inclusion within a local region defined by a donut-shaped ring. The invention preliminarily decides upon a grouping of clocked loads, including a preliminary decision as to the donut-shaped region wherein each clocked load should be located, for example region A or region B in FIG. 3B. On the initial decision, any clocked load found within a region is associated with an adjacent donut-shaped island and its region buffer.

At step 58, the donut-shaped rings are precisely filled. The present invention calculates the exact location of each clocked load within a donut-shaped ring to ensure that the path length from each final region buffer to each clocked load is substantially the same. FIG. 3A depicts a typical placement of clocked loads following step 58.

At step 59, the netlist (DEF) is updated to assign new and unique clock net names for the clocked loads that have now been located within the appropriate region donut-shaped ring. The updated netlists will be used to accomplish the actual interconnections to the clocked loads. Steps 52, 58 and 59 are repeated for all soft groups, until every clocked load has been placed, essentially the same constant distance from an associated region buffer.

At this juncture, the final routing has been completed, taking perhaps three hours to complete, and time $T_B$ ideally will be less than about 200 ps. At step 61, the present invention generates the preplacement command files for the clocked devices, and generates an updated netlist. Preferably this information is stored in a format recognizable by a standard placement-router system, e.g., Gate Ensemble. The generated updated netlist (60A) and clocked device preplacement batch command file (60B) are then stored. (This information is received and used at steps 64 and 66 in FIG. 6, following.)

Figure 6:
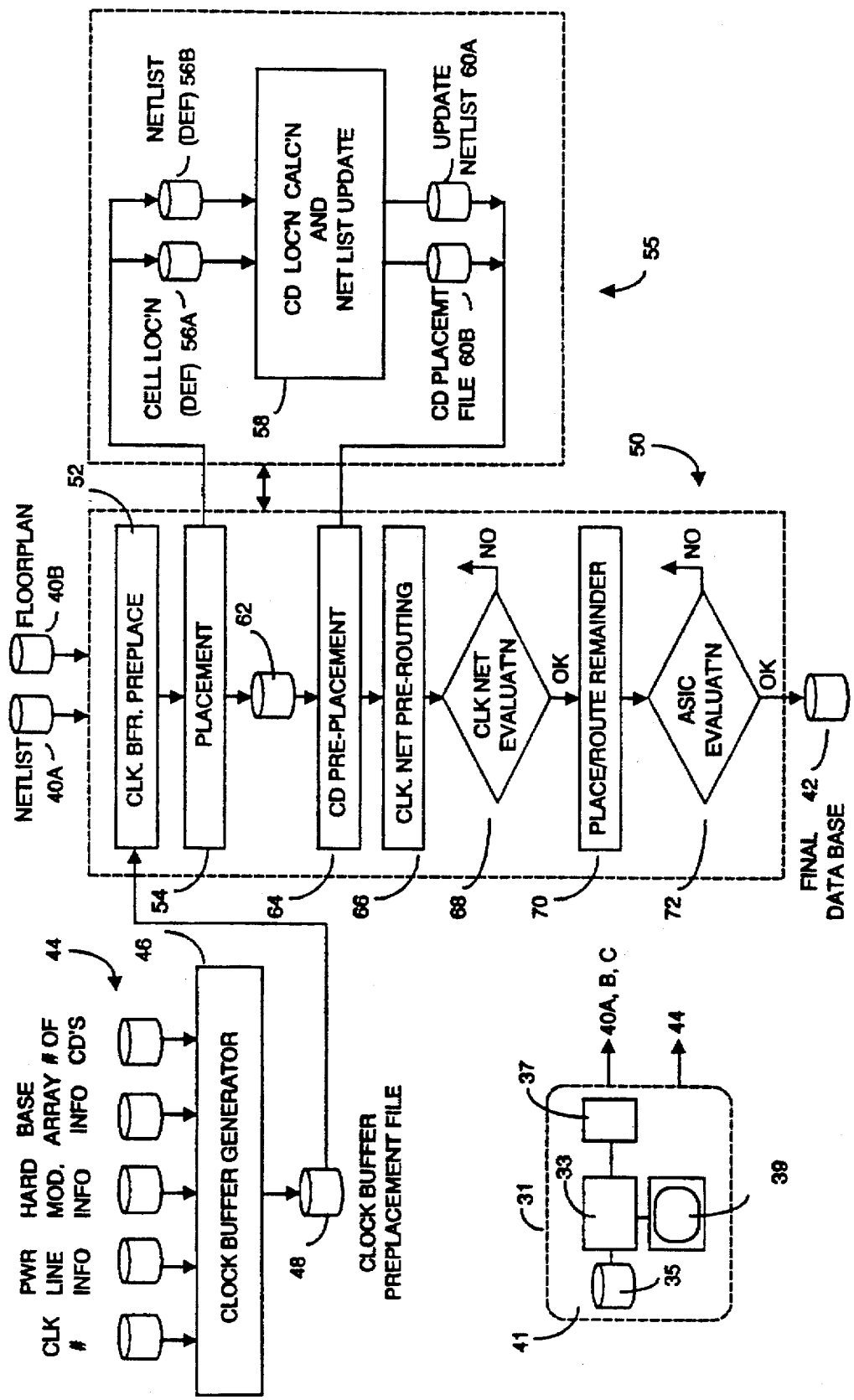
FIG. 6 is a further detailed flow diagram of the present invention.

FIG. 6 is a flow diagram of the present invention, wherein details beyond what was shown in FIG. 5 are indicated. At the top of FIG. 6, the ASIC-designer provided inputs are shown. At the bottom of the figure, the output provided by the present invention includes a final data base 42 that contains placement data for the interconnect metal traces and placement of the various clocked loads within the donut-shaped regions surrounding an associated region or island buffer. The output data base is provided as control input to a conventional placement router system.

In FIG. 6, block 44 describes how the metal interconnect traces are located, according to the present invention. More specifically, to form the "H"-shaped tree interconnect patterns, the number of buffers located at the tips of the arms of the "H"'s must be determined. Clearly the area size of the underlying base array will dictate how many "H"-shaped traces can be formed.

Thus, input to block 44 includes the number of clocks (since the present invention may be used to route multiple clocks), information as to voltage power lines, hard module information, base array information, and the number of clocked loads or devices (abbreviated as "CD's"). As noted, it is important to know where voltage power lines must be routed, and where immovable modules (e.g., element 16 in FIG. 1) have been located as the areas they define unusable areas for purposes of practicing the present invention. Where required, arms on the "H"-shaped trees will be trimmed to avoid traversing these unusable areas. However, such trimming will not unbalance impedance loading due to the buffering provided.

The input information is processed at step 46 and the clock buffer pre-placement file is provided and stored at step 48. This information is analogous to what is shown in FIG. 1, with respect to metal interconnect trace layouts, location of the master clock or buffer 18, intermediate buffers (if any), joiner cells, and location of the regional buffers.

Preferably the clock distribution is a command script that describes the actual clock placement and routing layout on the selected base array (e.g., layer 4). Command script may, of course, be provided as control input to the placement and routing system. The clock distribution is provided as a command set input to a conventional placer/router system that will initially place and route the clock distribution before the ASIC design is input. Clock distribution will of course be optimized to minimize clock skew. For base chips of the same type, the metallization interconnect trace pattern on levels 6 and 8 preferably will be invariant, independent of the specifics of the ASIC design. This practice advantageously ensures that clock distribution will be constant for all base chips of the same type.

Upon completion of block or step 46, the base array at layer 4 will have been evenly divided into grid-defined regions, with clock buffer islands having been preplaced in the center of these regions. See, for example, FIG. 3A. A clock buffer preplacement file 50 stores this information as input, along with netlist 40A and floor plan 40B, into a conventional placement router system 48.

Netlist 40A contains interconnect information for all unbuffered gates and cells specified by the ASIC designer, except that the on-chip clock is but a single net (e.g., "CLOCKNET"), which net is coupled to all clocked devices. Of course, multiple clocks would each have their own named net. Also included in 40A is the actual functional netlist for the remainder of the underlying base array circuit.

More specifically, as shown in the bottom left corner of FIG. 6, the present invention preferably operates under control of a computer system 31 that includes a processor sub-system 33 coupled to storage device 35, to user input means 37, and to output means 39. An algorithm implementing the present invention 41 is preferably stored within storage device 35, a program that contains the present invention 41.

At step 52, a pre-placement of clock buffers occurs, using the information thus far received. The base array level 4 is evenly divided into initial grid-defined regions, e.g., 1,800 μm on a side. As indicated by step 54, placement takes perhaps 2–3 hours for the preferred embodiment, although other durations are of course possible.

Block 55 in FIG. 6 serves to update the net from one net clock to many nets that will satisfy the real clock distribution. Block or step 55 ensures that every clocked device is associated with a unique net. As a result, an updated net list will be created accounting for proper joiner cell placement and reflecting the new clock distribution. Thus, instead of a single clock net, nets are created defining joiner cell interconnects, joiner cell to buffer interconnects, and so forth. At steps 56A, 56B, the clock buffer placement information is stored in the cell location definition and netlist definition for the ASIC.

At step 58, placement of the clocked loads occurs, preferably within the above-described donut-like band surrounding the associated local region buffer. At steps 60A and 60B, the netlist and clocked load placement file are suitably updated. The new or updated netlist replaces the global clock with clock nets from the clock buffers in the clock distribution. As noted, the association between clock buffers and clocked loads is determined by the region or area wherein the clocked loads are assigned. Preferably, the clock buffers are coupled to equal clocked loads (or their equivalent) to minimize load impedance effects upon skew.

According to the present invention, two factors control assignment of clocked loads to clock drivers: the ASIC designer's specification of the regional area wherein the clocked loads are to be assigned, and the assignment of clocked loads to drivers is balanced by the input load of the driving buffer. All clock nets preferably are equally loaded, and the assigned clock nets are back annotated into the netlist, updating the netlist to include all clock distribution data. A report of clock nets and their destination clocked loads preferably is provided.

It will be appreciated that the goal of automatic clocked load balancing is to keep all variations in clock skew dependent upon the final clock load interconnect length. This design goal is accomplished by presenting constant loads to each region clock buffer, and by placing the clocked loads in small donut-shaped regions that surround the region clock buffer. Balanced clock nets result from assigning the same number of clocked loads to each clock buffer. In the event more clocked loads are required than exist, "dummy loads" will be designed as a small cell that provides a standing input gate load, and will provide the requisite load matching. The assignment of clocked loads to the clock buffers is balanced by the input loading of the destined device.

The previously stored placement data, step 62, are now combined with the updated clocked load placement file and updated netlist data, at step 64, with resultant preplacement of the clocked loads. Initially one may manually pre-place the various clock buffers at an "island" center of each region. Next, at step 66, clock net prerouting of the clock buffers occurs, and the clock net is evaluated at step 68.

As the clock buffers per se are not as yet fabricated, preferably a library-simulated delay calculation will be carried out to evaluate the present state of the clock net. This evaluation may be made with computer system 31 (FIG. 6). Initially, a so-called normal cell will be used for the initial run, and the resulting delay calculation will be used as a guideline to correlate clock skew to the buffer region grid lines.

If the step 68 evaluation is not acceptable when compared to stored acceptable criteria, the procedure returns to step 64 for relocation of clocked loads. However, if acceptable, the procedure continues to step 70, whereupon the rest of the ASIC circuit will be placed and routed.

At step 72, the circuit placement thus far is evaluated as a whole. If unacceptable, the procedure returns to step 64. Optionally, associated with step 72 capacitance may be adjusted using techniques known to those skilled in the relevant art. If the step 72 evaluation is acceptable when compared to stored acceptable data, the placement and routing information thus far generated is stored in the final data base 42.

For each quadrant or each region on the base array, a set of clock distribution patterns is thus provided, with the option existing for sharing of a single input clock among more than one clock quadrant. Preferably these clock distribution patterns are determined at one time, and will be provided as input to the placement-routing system, based upon the ASIC designer's input. According to the present invention, the trace interconnect pattern will be fixed, such that the placer/router will locate the same pattern on all base arrays of the same circuit type.

Thus, data base 42 contains the information that is provided to the production facility for use in creating masks for laying out and fabricating the ASIC.

Figure 7:
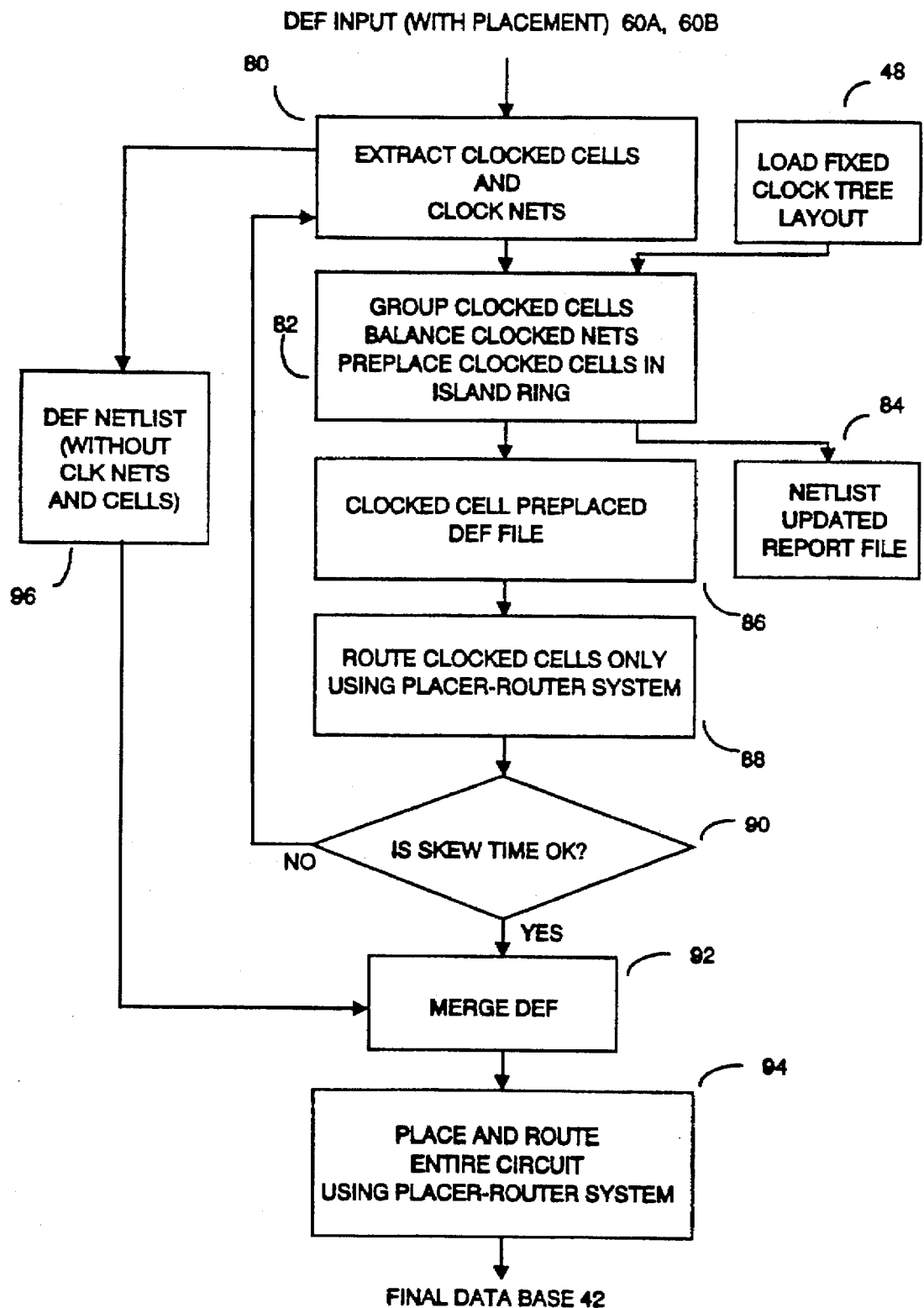
FIG. 7 provides an overall view of the software data flow, according to the present invention.

Turning now to FIG. 7, further details as to the iterative functioning of the present invention are depicted. At the top of the figure, an output DEF is provided as input. This output DEF file includes clocked load and trace interconnect placement, including all clock driver component names and place locations within a "COMPONENTS" section of the file. Preferably this prerouted information is in a NETS format for ease of practicing the present invention with conventionally available placement routing systems. Within a NETS parameter, clock nets are designated "+ USE CLOCK", and each statement within a NETS heading describes a single net. The name "NETNAME" preferably is given to identify a net, and preferably a list of pins to coupled to the net may also be specified. Each pin preferably is identified by a component name (compNAME) and a pin name pair (pinNAME).

Step 80 in FIG. 7 preferably is implemented as a modularized program. At step 80, the clocked nets are first parsed. Based upon the ASIC designer's preferred clocked load placement, clocked loads are extracted from the base array and are assigned with associated clock or buffer drivers in a preferred donut-shaped region or area. After all component names are parsed from the clock nets, the present invention at step 80 goes to the COMPONENTS net part to extract each component, including placement and orientation information.

At step 82, which preferably is also a modularized program, the extracted output information from step 80 and the fixed clock tree layout 48 are received. At this time, the clocked loads are grouped, the clocked nets are balanced, and the clocked loads are preplaced within the donut-shaped (or elliptical-shaped) rings as depicted in FIG. 3A, and represented by step 86.

At step 84, the netlist is updated and a DEF report file is generated and provided as an output. The report includes clock delay and skew, and an analysis of existing, placed, and route clock distribution. The DEF-modified netlist provided at step 84 reflects all new nets created for the clock distribution. (FIG. 8D is an example of a DEF modification file as generated at this point.) The DEF modification file takes into account delay from the IC chip input pin coupled to input pad 39 to each clock buffer input (see FIGS. 2A and 2B), for all destinations of the clock distribution drivers. Preferably, software implementing the present invention can further calculate delay from each clock buffer input to the clocked load destinations.

At step 88, the clocked loads are routed using a conventional placement router system and at step 90 skew time is checked. If skew time is unacceptably large, the routing returns to step 80. At step 89, modifications may be made to the grouping, the balancing, and/or the clocked load placements, whereupon steps 80, 82, 86 and 88 are repeated until an acceptable skew time results.

At step 92, which preferably is a modularized program, if the skew time is acceptable, the netlist omitting the clock and the netlist including the clock are merged, and the ASIC may be placed and routed. More specifically, at step 92 the DEF netlist (excluding clock nets and clocked loads) is received from step 96 and a merged DEF is generated. Module 92 receives a first input that is the original DEF file of the entire ASIC design (obtained from step 96), and a second input that is the output DEF file provided at step 88 from the placement routing system. This output DEF file includes the forced placement of the full clock distribution, and also provides actual interconnect information from the final clock buffer drivers to the clocked loads.

The system user may monitor progress using a display 39 associated with computer system 31. Once an acceptable skew time is apparent to the user, the user can preserve the pre-set clocking network in DEF format, again via computer system 31. At step 92, the pre-set clocking network DEF file is merged into the original DEF file, whereupon the Gate Ensemble (or other conventional) module shown as 88 in FIG. 8 can continue to place and route the rest of the ASIC design.

Skew calculations should be accurate for a user to make a meaningful decision that skew is acceptable. These calculations should account for wire-to-wire cross-coupling in the ASIC, wire-to-substrate coupling, and the effects of loading as seen through the master clock driver. In the preferred embodiment, a separate software program is implemented to report delay and skew variations, based upon each specified primary input clock. The reported parameters preferably include a listing of delay by path length, and by maximum skew variation.

At step 94, a preferably conventional system places and routes the entire ASIC circuit, and provides as output a preferably DEF format final data base 42, described earlier with respect to FIG. 6.

FIGS. 8A-8D depict how information is input to the present invention.

FIG. 8A is an example of an input DEF file in ASCII syntax. Generally, a DEF file may contain six sections that relate to design, connecting vias, components, nets (regulars and special), groups, and timing constraints. The DEF listing of FIG. 8A shows COMPONENTS and NETS sections in a netlist-like ASCII format that will be familiar to those skilled in the relevant art. The COMPONENTS section will provide a component list for the design, and may include placements for some (or all) components. The NETS section provides a net-based listing of the connectivity of the design, and may include interconnect trace layout for some (or all) nets.

In FIG. 8A, the COMPONENTS numComps parameter indicates the number of clocked loads requiring balancing, while the compName parameter specifies the component instance name within the ASIC design and is an instance of modelName. The ModelName parameter names a model defined within the software library used with the present invention. ModelName is specified for each compName in the preferred embodiment.

A component may have a PLACED state, indicating that the component has a location, but the component may be relocated during subsequent automatic layout. Location and orientation parameters may be specified for a located component, e.g., (x, y co-ordinant points, and orientation), where orientation is N, S, E, W (e.g., compass points) or FN, FS, FE, FW (e.g., directions with a "flip" about the x-axis). Alternatively, a component may be designated "N", which means the component may not be relocated.

FIG. 8B is a further example of an input DEF file, wherein fixed clock destinations are placed, and wherein unit distance is 100 μm. The nomenclature used means that INST1 (instance 1) is a cell type designated AN1 and has been placed at location 100, 100. The "N" designates that INST1 is placed and may not be relocated. END COMPONENTS is a netlist format listing of, for example, the power supply VDD routing, which is shown coupling INST1 A to INST2 A to INST3 A and so forth. The A, B, C letters refer to pin numbers on the devices being coupled to VDD.

FIG. 8C is an example of an output DEF file, and contains files relating only to the clocked loads and clock nets contained in the COMPONENTS and NETS section. NET3, for example, couples a clock from pin B of INST7 to pin B of INST8 to pin B of INST9, and so forth.

FIG. 8D is a DEF listing wherein joiner cells are designated CBB, and wherein, for example, CLK1_DR1 (clock driver 1) is shown as coupled to a joiner cell CBB that is immovably placed at coordinate 1700,100. CLK1-NET1 is shown as coupling pin CLK of CLK1-DR1 then to pin B of INST7 (a clocked load destination), then to pin B of INST8 (a clocked load destination), and so on. At this juncture, it is understood that INST7, INST8, and so on are distributed and positioned within a donut-shaped ring surrounding CLK1_DR1, preferably substantially equidistant from CLK1_DR1.

To recapitulate, the IC chip is grid partitioned, and a series of netlists and a priority order in which the netlists should be routed is created. Metallization interconnect traces couple an on-chip clock to regional buffers, the traces preferably forming a generally "H"-shaped configuration dictated by joiner cell placement. The interconnect lengths are made equal both in total length and in sub-lengths per metallization layer to minimize skew macroscopically.

Donut-shaped (or elliptical-shaped) islands are created surrounding each regional buffer. Clocked loads to be coupled to the on-chip clock signal are positioned within these island rings, substantially equidistant electrically from the associated regional buffer to minimize skew microscopically. An updated series of nets defines the clocked load connections. A conventional placement router system then routes the "H"-shaped metal interconnects, the clocked load interconnects within the various islands, and then the remainder of the ASIC.

The present invention has been described with respect to minimizing skew associated with interconnect traces and buffer/clocked load placement in an integrated circuit formed on a semiconductor substrate. However, it will be appreciated that such traces and placements could in fact be carried out for a circuit having one or more layers formed on a printed circuit board substrate.

Modifications and variations may be made to the disclosed embodiments without departing from the subject and spirit of the invention as defined by the following claims.

What is claimed is:

1. For use with a circuit having a master buffer unit receiving a clock signal and a plurality of regional buffers to be coupled to said master buffer and a plurality of clocked loads to be coupled to a chosen one of said plurality of regional buffers, said circuit being fabricated on a substrate that includes at least a first overlying layer of interconnect traces that couple said clock signal to said plurality of regional buffers, a method for reducing clock skew, the method comprising the following steps:

(a) grid-partitioning said substrate into a number of uniquely identifiable regions;

(b) positioning said master buffer unit on said substrate;

(c) positioning each of said plurality of said regional buffers centrally on chosen ones of said regions;

(d) providing a substantially equal length interconnect trace to each of said plurality of regional buffers in each of said regions on said first overlying layer by inserting phantom, joiner cells in selected ones of said interconnect traces between said master buffer and selected regional buffers so that substantially equal length traces to each of said plurality of regional buffers are defined;

(e) associating a chosen plurality of said clocked loads with said chosen regional buffer, said chosen plurality of said clocked loads being positioned a substantially equal distance within a ring-shaped area from said chosen regional buffer; and (f) coupling said plurality of clocked loads to each said plurality of regional buffers.

2. The method of claim 1, wherein said substrate is a semiconductor wafer, and wherein said circuit is an integrated circuit fabricated upon said semiconductor wafer.

3. The method of claim 1, wherein said substrate is a printed circuit board.

4. The method of claim 1, wherein said master buffer unit includes a plurality of master buffers such that each said plurality of regional buffers is coupled to a said master buffer.

5. The method of claim 1, wherein at step (d) said interconnect traces form "H"-shaped patterns whose centers overlie said chosen regional buffer and at least some of whose "H"-arm termini overlie said chosen regional buffer.

6. The method of claim 1, further including a second overlying layer of interconnect traces that couple said clock signal to said plurality of regional buffers, wherein at step (d), said substantially equal length interconnect traces include equal-length sub-lengths formed on each of said first and said second overlying layers.

7. The method of claim 1, wherein at step (e), each said plurality of regional buffers is coupled to a substantially equal number of said clocked loads.

8. The method of claim 1, wherein step (a) is accomplished in response to an input netlist providing information as to circuit area, number of said regional buffers, number of said clocked loads, and regions of said substrate not traversable by said interconnect traces.

9. The method of claim 5, wherein step (d) includes defining a series of netlists that define a conductive path from said master buffer unit to a center of each said "H"-pattern.

10. The method of claim 5, wherein at step (d), said "H"-shaped patterns are dictated by placement of joiner cells whose presence forces a placement router tool to route said traces through each said joiner cell and then turn 90°.

11. The method of claim 5, wherein at step (d), a series of netlists is generated specifying a conductive path from said master buffer to at least each of said plurality of regional buffers.

12. The method of claim 1, wherein step (f) is carried out by a placement router tool whose routings are constrained by placement of said plurality of clock loads to be substantially equidistant from said chosen regional buffer.

13. The method of claim 1, including the further step (g) of placing and routing other components and non-clocked traces.

14. The method of claim 1, wherein said master buffer unit is centrally positioned on said substrate.

* * * * *